United States Patent [19]

Sandhu

[11] Patent Number: 5,359,240

[45] Date of Patent: Oct. 25, 1994

[54] LOW POWER DIGITAL SIGNAL BUFFER CIRCUIT

[75] Inventor: Bal S. Sandhu, Fremont, Calif.

[73] Assignee: National Semiconductor Corporation, Santa Clara, Calif.

[21] Appl. No.: 8,165

[22] Filed: Jan. 25, 1993

[51] Int. Cl.$^5$ ............... H03K 19/20; H03K 19/0175
[52] U.S. Cl. ..................... 307/451; 307/475; 307/443
[58] Field of Search ................ 307/451, 475, 443

[56] References Cited

U.S. PATENT DOCUMENTS

| | | | |
|---|---|---|---|
| 4,347,447 | 8/1982 | Proebsting | 307/548 |
| 4,568,844 | 2/1986 | O'Conner | 307/475 |
| 4,724,342 | 2/1988 | Sato et al. | 307/450 |
| 4,763,021 | 8/1988 | Stickel | 307/475 |
| 4,808,852 | 2/1989 | Kousaka et al. | 307/451 |
| 4,920,287 | 4/1990 | Hartgring et al. | 307/451 |
| 5,087,841 | 2/1992 | Rogers | 307/475 |
| 5,115,434 | 5/1992 | Aizaki | 307/475 |
| 5,144,167 | 9/1992 | McClintock | 307/475 |
| 5,229,659 | 7/1993 | Sandhu | 307/451 |

FOREIGN PATENT DOCUMENTS

| | | |
|---|---|---|
| 0082567A2 | 6/1983 | European Pat. Off. |
| 59-216326(1) | 4/1985 | Japan . |
| 62-069719(A) | 8/1987 | Japan . |

*Primary Examiner*—Edward P. Westin
*Assistant Examiner*—Andrew Sanders
*Attorney, Agent, or Firm*—Limbach & Limbach

[57] ABSTRACT

A low power signal buffer circuit for TTL signals includes a voltage reference controlled complementary MOSFET ("C-MOSFET") amplifier and a C-MOSFET inverter. The voltage reference controlled C-MOSFET amplifier receives a fixed reference voltage and a TTL input signal and provides a reference bias voltage. The C-MOSFET inverter has a pull-up P-type MOSFET which receives and is biased by the reference bias voltage, and a pull-down N-type MOSFET which receives the TTL input signal. The C-MOSFET inverter provides a TTL output signal with a substantially increased dynamic signal amplitude range. Current drain from the DC power supply for the buffer circuit decreases significantly as the TTL input signal state changes from "low" to "high" (e.g. logical "zero" to logical "one").

14 Claims, 3 Drawing Sheets

LOW POWER DIGITAL SIGNAL BUFFER CIRCUIT

BACKGROUND OF THE INVENTION

1. Field of the Invention

The present invention relates to digital signal buffer circuits, and in particular, to complementary metal oxide semiconductor field effect transistor ("C-MOSFET") circuits for buffering transistor-transistor logic ("TTL") level signals.

2. Description of the Related Art

Digital signal buffer circuits are commonly used for such purposes as signal or circuit isolation, impedance matching, or improvement of circuit fan-in and fan-out characteristics. A common type of buffer circuit design is an inverter circuit.

Referring to FIG. 1, a conventional inverting buffer circuit often uses complementary MOSFETs Qa, Qb, Qc, Qd. Signal inversion is performed by P-type MOSFET ("P-MOSFET") Qc and enhancement mode N-type MOSFET ("N-MOSFET") Qd which are mutually coupled in a totem-pole configuration. The gates of MOSFETs Qc and Qd are connected together and pulled up by enhancement mode N-MOSFET Qa and depletion mode N-MOSFET Qb which are mutually coupled in a totem-pole configuration. The pull-up MOSFETs Qa and Qb, because of their drain-gate and gate-source connections, respectively, act as a resistive pull-up for the gates of the inverter MOSFETs Qc and Qd. Typical MOSFET channel parameters for the buffer circuit of FIG. 1 are as shown below in Table 1.

TABLE 1

| MOSFET (TYPE) | (FIG. 1 [PRIOR ART]) CHANNEL WIDTH (MICRONS [μ]) | CHANNEL LENGTH (MICRONS [μ]) |
| --- | --- | --- |
| Qa (N enh.) | 30 | 8 |
| Qb (N depl.) | 4 | 8 |
| Qc (P) | 50 | 1.2 |
| Qd (N enh.) | 190 | 1.2 |

Referring to FIG. 2, an alternative conventional MOSFET buffer circuit includes P-MOSFETs Qe and Qh, and enhancement mode N-MOSFETs Qf, Qg and Qi, interconnected as shown. The pull-up MOSFET Qe and the parallel combination of pull-down MOSFETs Qf and Qg are coupled in a totem-pole configuration as one inverter, with pull-up MOSFET Qh and pull-down MOSFET Qi comprising another inverter. Together, these inverters buffer the input signal and produce an in-phase output signal. Typical MOSFET channel parameters for the buffer circuit of FIG. 2 are as shown below in Table 2.

TABLE 2

| MOSFET (TYPE) | (FIG. 2 [PRIOR ART]) CHANNEL WIDTH (MICRONS [μ]) | CHANNEL LENGTH (MICRONS [μ]) |
| --- | --- | --- |
| Qe (P) | 60 | 1.3 |
| Qf (N enh.) | 120 | 1.3 |
| Qg (N enh.) | 30 | 1.3 |
| Qh (p) | 90 | 1.0 |
| Qi (N enh.) | 80 | 1.0 |

While the foregoing exemplary conventional buffer circuits are satisfactory for many applications, one operating characteristic in particular has become increasingly problematic, namely, DC power consumption for TTL-to-CMOS signal level conversion. The need for a low power digital signal buffer circuit has become more critical as the total number of input/output ("I/O") pins on many integrated circuits increases. In other words, as more and more input and output signals must be buffered, total DC power consumption becomes increasingly significant.

Typical DC current drain from the power supply VDD (=VCC for TTL operation) for the buffer circuits shown in FIGS. 1 and 2, with the input signal level at a TTL logic high of approximately 2 volts, is approximately 3-5 milliamperes ("mA"), depending upon the actual power supply voltage (VCC) and ambient temperature. When upwards of 20 I/O ports are active, the total DC current, and therefore DC power, consumption becomes significant—even for only the buffer circuits. It would be desirable to have a low power digital signal buffer circuit design in which this DC current drain is significantly reduced.

SUMMARY OF THE INVENTION

A low power signal buffer circuit in accordance with the present invention includes a signal inverter and an active reference signal generator. The signal inverter receives an active reference signal and a digital input signal, and inverts the digital input signal in accordance with the active reference signal to provide a buffered digital output signal. The active reference signal generator receives a fixed voltage and the digital input signal, and in accordance therewith provides the active reference signal to the signal inverter.

In a preferred embodiment of the present invention, the active reference signal generator includes mutually coupled MOSFETs, one of which receives the fixed voltage and digital input signal. The signal inverter includes mutually coupled pull-up and pull-down MOSFETs, with the pull-up MOSFET receiving the active reference signal.

A low power signal buffer circuit in accordance with the present invention draws a DC supply current which is significantly less when the digital input signal is at a high logic level, than when the digital input signal is at a low logic level. Further, a low power signal buffer circuit in accordance with the present invention provides an output signal with a dynamic signal amplitude range which is greater than that of the input signal.

These and other features and advantages of the present invention will be understood upon consideration of the following detailed description of the invention and the accompanying drawings.

DETAILED DESCRIPTION OF THE INVENTION

Figure 3:
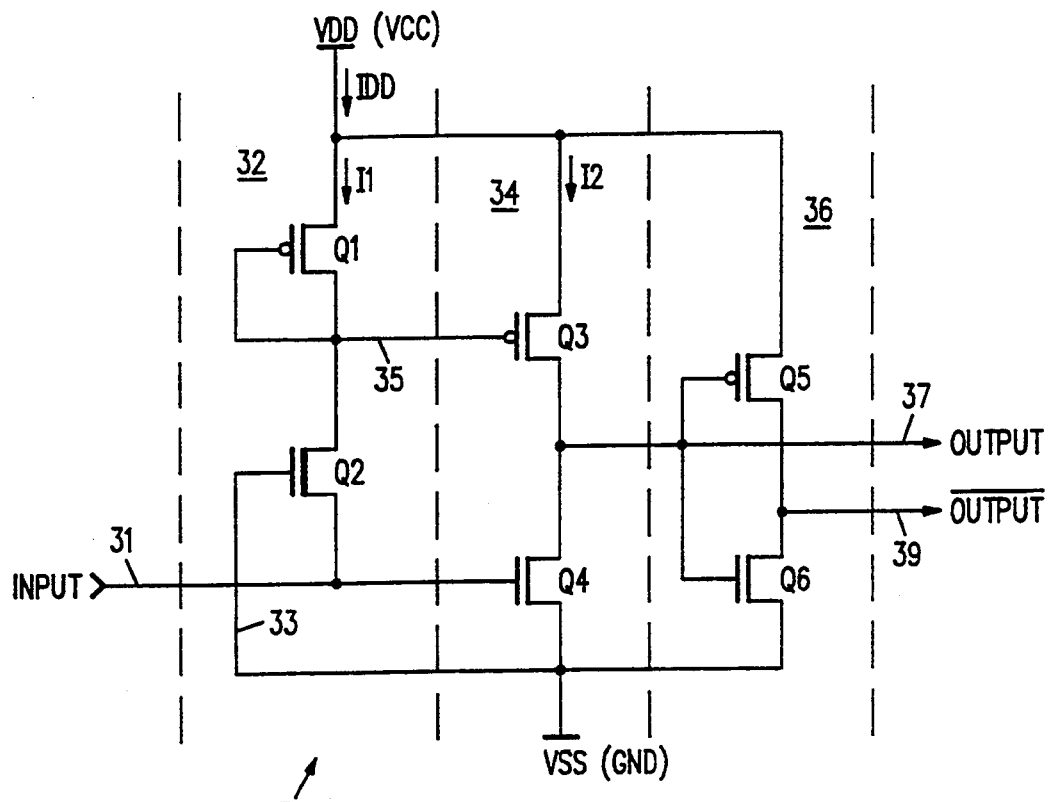
FIG. 3 is a schematic diagram of a preferred embodiment of a low power signal buffer circuit in accordance with the present invention.

Referring to FIG. 3, a low power signal buffer circuit 30 in accordance with the present invention includes an active reference signal generator 32, an input inverter 34 and an output inverter 36. The circuit 30 is biased between positive VDD and negative VSS power supply terminals which are +5 volts DC (VCC) and circuit ground potential (GND) for operation with TTL signals. The active reference signal generator 32 receives a TTL input signal 31 and a fixed voltage 33, and produces in accordance therewith, an active reference signal 35. The input inverter 34 receives the active reference signal 35 and the TTL input signal 31, and in accordance therewith, inverts the TTL input signal 31 to produce a buffered output signal 37. The output inverter 36 inverts the output signal 37 to produce its complement-phase signal 39.

The active reference signal generator 32 includes pull-up P-MOSFET Q1 and pull-down depletion mode N-MOSFET Q2 coupled in a totem-pole configuration. The source of Q1 is connected to VDD (e.g. VCC for TTL signal operation), and the gate and drain are connected to the drain of MOSFET Q2 to provide the active reference signal 35. The source of MOSFET Q2 receives the TTL input signal 31, and the gate is connected to VSS (e.g. circuit ground potential GND for TTL signal operation).

The input inverter 34 includes pull-up P-MOSFET Q3 and pull-down enhancement mode N-MOSFET Q4 coupled in a totem-pole configuration. The source of MOSFET Q3 is connected to VDD, the gate is connected to the drains of MOSFETs Q1 and Q2 to receive the active reference signal 35, and the drain is connected to the drain of MOSFET Q4 to provide the output signal 37. The gate of MOSFET Q4 is connected to the source of MOSFET Q2 and receives the TTL input signal 31, and the source is connected to VSS.

Output inverter 36 includes pull-up P-MOSFET Q5 and pull-down enhancement mode N-MOSFET Q6 coupled in a totem-pole configuration. The source of MOSFET Q5 is connected to VDD, the source of MOSFET Q6 is connected to VSS, and the gate and drain of MOSFET Q5 are connected to the gate and drain of MOSFET Q6, respectively, to receive and provide the output signal 37 and its complement-phase signal 39, respectively.

Exemplary MOSFET channel parameters for the MOSFETs Q1–Q6 in the buffer circuit 30 of FIG. 3 are as shown below in Table 3.

TABLE 3

| MOSFET (TYPE) | (FIG. 3) CHANNEL WIDTH (MICRONS [µ]) | CHANNEL LENGTH (MICRONS [µ]) |
|---|---|---|
| Q1 (P) | 3 | 25 |
| Q2 (N depl.) | 3.8 | 1 |
| Q3 (P) | 60 | 1.3 |
| Q4 (N enh.) | 120 | 1.3 |
| Q5 (P) | 90 | 1.0 |
| Q6 (N enh.) | 80 | 1.0 |

Figure 4:
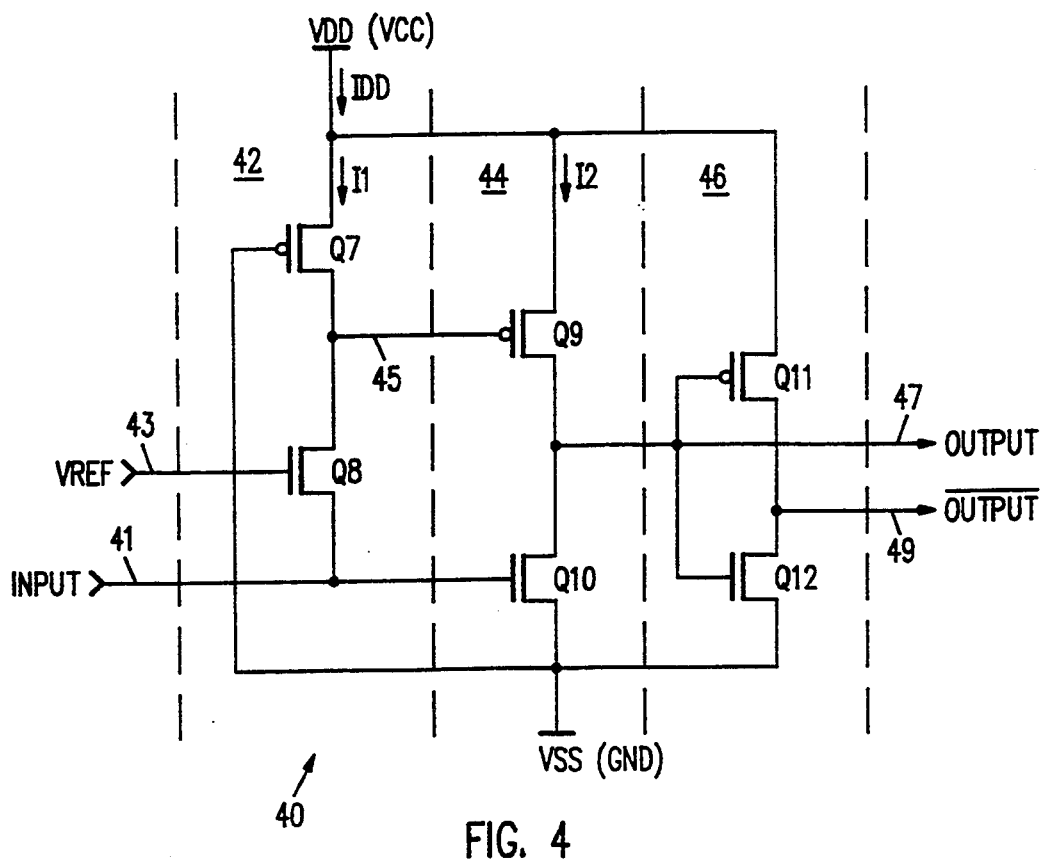
FIG. 4 is a schematic diagram of an alternative preferred embodiment of a low power signal buffer circuit in accordance with the present invention.

Referring to FIG. 4, an alternative preferred embodiment of a low power signal buffer circuit 40 in accordance with present invention also includes an active reference signal generator 42, input inverter 44 and output inverter 46. Similar to the buffer circuit 30 of FIG. 3, the buffer circuit 40 of FIG. 4 has an active reference signal generator 42 which receives a fixed reference voltage VREF 43 (preferably within the range of 2–3 volts) and a TTL input signal 41, and produces therefrom an active reference signal 45. The input inverter 44 receives the active reference signal 45, and in accordance therewith, inverts the TTL input signal 41 to produce a TTL output signal 47. The output inverter 46 receives and inverts the output signal 47 to produce its complement-phase signal 49.

The active reference signal generator 42 includes pull-up P-MOSFET Q7 and pull-down enhancement mode N-MOSFET Q8 coupled in a totem-pole configuration. The source of MOSFET Q7 is connected to VDD, the gate is connected to VSS and the drain is connected to the drain of MOSFET Q8 to provide the active reference signal 45. The source of MOSFET Q8 is connected to receive the TTL input signal 41 and the gate is connected to receive the reference voltage VREF 43.

The input inverter 44 includes pull-up P-MOSFET Q9 and pull-down enhancement mode N-MOSFET Q10 coupled in a totem-pole configuration. The source of MOSFET Q9 is connected to VDD, the gate is connected to the drains of MOSFETs Q7 and Q8 to receive the active reference signal 45, and the drain is connected to the drain of MOSFET Q10 to provide the output signal 47. The source of MOSFET Q10 is connected to VSS and the gate is connected to the source of MOSFET Q8 and receives the TTL output signal 41.

The output inverter 46 includes pull-up P-MOSFET Q11 and pull-down enhancement mode N-MOSFET Q12. The sources of MOSFETs Q11 and Q12 are connected to VDD and VSS, respectively. The gate and drain of MOSFET Q11 are connected to the gate and drain of MOSFET Q12, respectively, to receive and provide the output signal 47 and its complement-phase signal 49, respectively.

Exemplary MOSFET channel parameters for the MOSFETs Q7–Q12 in the buffer circuit 40 of FIG. 4 are as shown below in Table 4.

TABLE 4

| MOSFET (TYPE) | (FIG. 4) CHANNEL WIDTH (MICRONS [µ]) | CHANNEL LENGTH (MICRONS [µ]) |
|---|---|---|
| Q7 (P) | 3 | 25 |
| Q8 (N enh.) | 3.8 | 1 |
| Q9 (P) | 60 | 1.3 |
| Q10 (N enh.) | 120 | 1.3 |
| Q11 (P) | 90 | 1.0 |
| Q12 (N enh.) | 80 | 1.0 |

Figure 5:
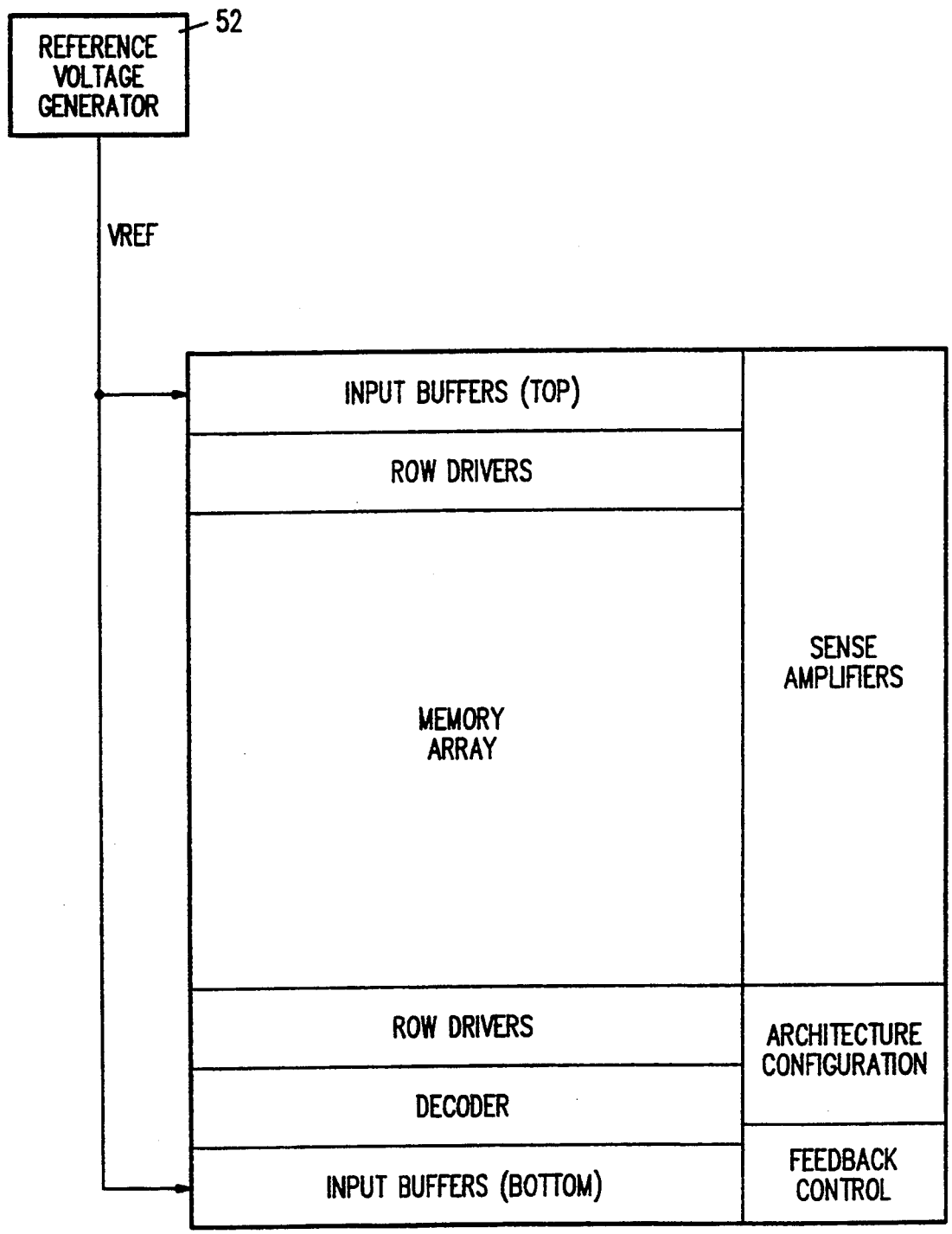
FIG. 5 is a diagram representing an exemplary integrated circuit chip layout for accommodating multiple low power signal buffer circuits in accordance with the present invention.

Referring to FIG. 5, an integrated circuit, such as a memory, can be designed to accommodate low power signal buffer circuits in accordance with the present invention by using a circuit function layout as shown. A single reference voltage generator 52 can be used to generate the reference voltage VREF for all input buffers, e.g. at the top and bottom of the memory array. Ideally, the reference voltage generator 52 should be designed to provide both temperature and power supply (VCC) compensation. Further, typically the reference voltage VREF should be designed to be approximately 1.5 volts above the threshold voltage VT of the N-MOSFETs. With a single reference voltage source, the input buffers will all track one another with respect to temperature and power supply compensation. Further, using a single reference voltage generator 52 has minimal impact on layout area and overall die size.

A low power signal buffer circuit in accordance with the present invention advantageously increases the dynamic signal range of the signal being buffered. In other words, whereas the TTL input signal will have the typical dynamic TTL signal range with lower and upper voltage levels of approximately 0.8 (logic low) and 2.0 (logic high) volts, respectively, the corresponding TTL output signal will have an increased dynamic signal range. This increase in dynamic signal range can be better understood by referring below to Table 5.

TABLE 5

DYNAMIC SIGNAL RANGE COMPARISON
Conditions: VCC = 5.0 volts
Temperature = 27° C.

Figure 1:
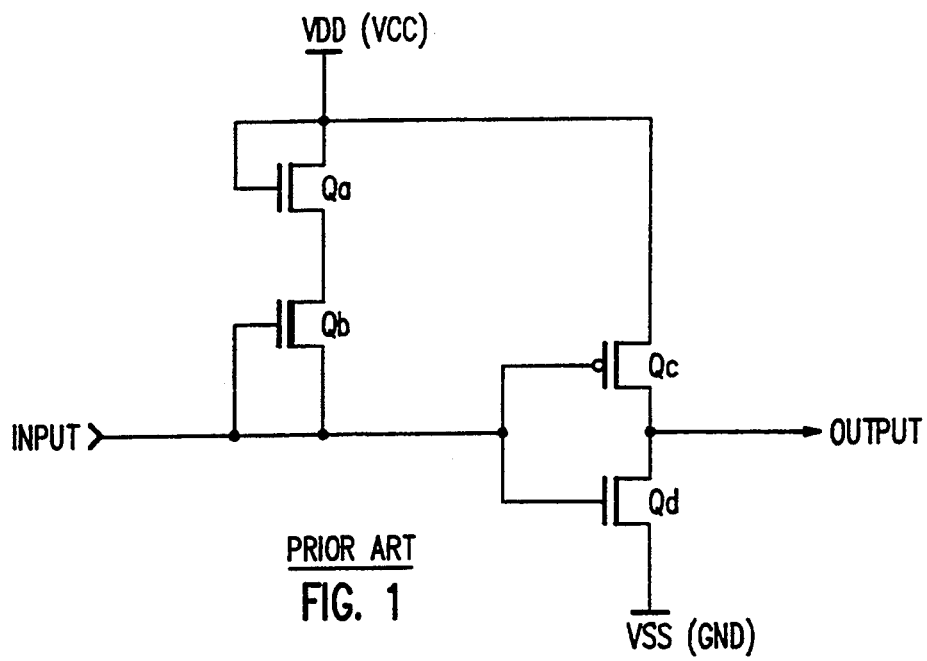
FIG. 1 is a schematic diagram of a conventional MOSFET buffer circuit.
Figure 2:
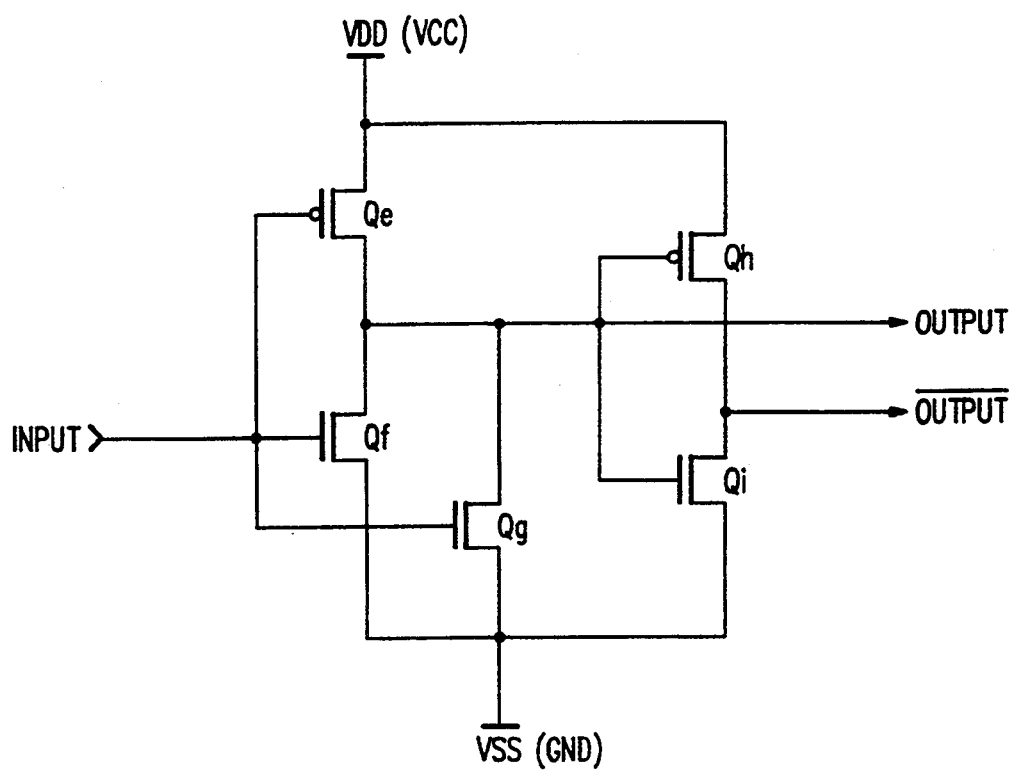
FIG. 2 is a schematic diagram of an alternative conventional MOSFET buffer circuit.

| TTL INPUT (volts) | PRIOR ART (FIG. 2) OUTPUT (volts) | INVENTION (FIG. 4) OUTPUT (volts) |
|---|---|---|
| 0.8 | 4.95 | 4.95 |
| 2.0 | 0.25 | ≈0 |
| 2.4 | 0.15 | ≈0 |
| 3.0 | 0.05 | ≈0 |

A low power signal buffer circuit in accordance with the present invention requires significantly less static DC supply current (e.g. sum of I1 and I2 in FIGS. 3 and 4), particularly when receiving a TTL input signal in a logic high state. Whereas the DC current consumption of a conventional buffer circuit increases with the logic level of the input signal, the DC current consumption of a buffer circuit in accordance with the present invention decreases, and does so significantly. In other words, when the input signal transitions from a logic low to a logic high level (e.g. 0→1), the DC current consumption of a buffer circuit in accordance with the present invention goes down instead of up. See Tables 6 and 7 below. Further, the resulting decrease in required DC power is substantially independent of power supply voltage and temperature variation.

TABLE 6

POWER DISSIPATION COMPARISON
Conditions: VCC = 5.0 volts
Temperature = 27° C.

| TTL INPUT (volts) | PRIOR ART (FIG. 2, Qe-Qg) BIAS CURRENT (mA) | POWER DISSIPATION (mW) | INVENTION (FIG. 4, Q7-Q10) BIAS CURRENT (mA) | POWER DISSIPATION (mW) |
|---|---|---|---|---|
| 0.8 | 0.0615 | 0.31 | 0.0509 | 0.25 |
| 2.0 | 3.16 | 15.8 | 0.0000187 | 0.0000935 |
| 2.4 | 2.34 | 11.7 | 0.00131 | 0.00655 |
| 3.0 | 1.3 | 6.5 | 0.00199 | 0.00995 |

TABLE 7

POWER DISSIPATION COMPARISON
Conditions: VCC = 5.5 volts
Temperature = −55° C.

| TTL INPUT (volts) | PRIOR ART (FIG. 2, Qe-Qg) BIAS CURRENT (mA) | POWER DISSIPATION (mW) | INVENTION (FIG. 4, Q7-Q10) BIAS CURRENT (mA) | POWER DISSIPATION (mW) |
|---|---|---|---|---|
| 0.8 | 0.0529 | 0.29095 | 0.0447 | 0.24585 |
| 2.0 | 4.76 | 26.18 | 0.0000961 | 0.00052855 |
| 2.4 | 3.79 | 20.845 | 0.00279 | 0.015345 |
| 3.0 | 12.42 | 68.31 | 0.00281 | 0.015455 |

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments.

What is claimed is:

1. A low power signal buffer circuit, comprising:
    input signal inverter means for receiving an active reference signal and a digital input signal, and for inverting said received digital input signal in accordance with said received active reference signal to provide a digital output signal; and
    active reference signal generator means coupled to said input signal inverter means for receiving at least one fixed reference voltage and said digital input signal and in accordance therewith providing said active reference signal;
    wherein said input signal inverter means and active reference signal generator means receive a dc supply current which includes first and second current levels, said received digital input signal includes low and high logic levels, said first and second current levels are received when said low and high logic levels are received, respectively, and said second current level is substantially less than said first current level.

2. A low power signal buffer circuit as recited in claim 1, wherein said input signal inverter means comprises a pull-up MOSFET and a pull-down MOSFET which are mutually coupled, and wherein said pull-up MOSFET receives said active reference signal.

3. A low power signal buffer circuit as recited in claim 1, wherein said active reference signal generator means comprises mutually coupled first and second MOSFETs, and wherein said first MOSFET receives said at least one fixed reference voltage and said digital input signal.

4. A low power MOSFET buffer circuit comprising:
    a pull-up MOSFET which includes a reference bias input terminal for receiving a reference bias voltage, and further includes a pull-up MOSFET output terminal;
    a pull-down MOSFET which includes an input signal terminal for receiving a TTL input signal, and further includes a pull-down MOSFET output terminal coupled to said pull-up MOSFET output terminal for providing a TTL output signal in accordance with said received reference bias voltage and said received TTL input signal; and
    reference bias voltage generator means coupled to said pull-up MOSFET for receiving at least one fixed reference voltage and said TTL input signal and in accordance therewith providing said reference bias voltage;
    wherein said pull-up MOSFET and reference bias voltage generator means receive a dc supply current which includes first and second current levels, said received TTL input signal includes low and high TTL logic levels, said first and second current levels are received when said low and high TTL logic levels are received, respectively, and said second current level is substantially less than said first current level.

5. A low power signal buffer circuit as recited in claim 4, wherein said reference bias voltage generator means comprises mutually coupled first and second MOSFETs, and wherein said first MOSFET receives said at least one fixed reference voltage and said TTL input signal.

6. A low power signal buffer circuit, comprising:
input signal inverter means for receiving an active reference signal and a digital input signal with a dynamic input signal amplitude range, and for inverting said received digital input signal in accordance with said received active reference signal to provide a digital output signal with a dynamic output signal amplitude range, wherein said dynamic output signal amplitude range is greater than said dynamic input signal amplitude range; and
active reference signal generator means coupled to said input signal inverter means for receiving at least one fixed reference voltage and said digital input signal and in accordance therewith providing said active reference signal;
wherein said input signal inverter means and active reference signal generator means receive a dc supply current which includes first and second current levels, said received digital input signal includes low and high logic levels, said first and second current levels are received when said low and high logic levels are received, respectively, and said second current level is substantially less than said first current level.

7. A low power signal buffer circuit as recited in claim 6, wherein said input signal inverter means comprises a pull-up MOSFET and a pull-down MOSFET which are mutually coupled, and wherein said pull-up MOSFET receives said active reference signal.

8. A low power signal buffer circuit as recited in claim 6, wherein said active reference signal generator means comprises mutually coupled first and second MOSFETs, and wherein said first MOSFET receives said at least one fixed reference voltage and said digital input signal.

9. A low power MOSFET buffer circuit comprising:
a pull-up MOSFET which includes a reference bias input terminal for receiving a reference bias voltage, and further includes a pull-up MOSFET output terminal;
a pull-down MOSFET which includes an input signal terminal for receiving a TTL input signal with a dynamic input signal amplitude range, and further includes a pull-down MOSFET output terminal coupled to said pull-up MOSFET output terminal for providing a TTL output signal with a dynamic output signal amplitude range in accordance with said received reference bias voltage and said received TTL input signal, wherein said dynamic output signal amplitude range is greater than said dynamic input signal amplitude range; and
reference bias voltage generator means coupled to said pull-up MOSFET for receiving at least one fixed reference voltage and said TTL input signal and in accordance therewith providing said reference bias voltage;
wherein said pull-up MOSFET and reference bias voltage generator means receive a dc supply current which includes first and second current levels, said received TTL input signal includes low and high TTL logic levels, said first and second current levels are received when said low and high TTL logic levels are received, respectively, and said second current level is substantially less than said first current level.

10. A low power MOSFET buffer circuit as recited in claim 9, wherein said reference bias voltage generator means comprises mutually coupled first and second MOSFETs, and wherein said first MOSFET receives said at least one fixed reference voltage and said TTL input signal.

11. A low power signal buffer circuit, comprising:
input signal inverter means for receiving an active reference signal and a digital input signal, and for inverting said received digital input signal in accordance with said received active reference signal to provide a digital output signal; and
active reference signal generator means coupled to said input signal inverter means for receiving at least one fixed reference voltage and said digital input signal and in accordance therewith providing said active reference signal, wherein said active reference signal generator means comprises mutually coupled first and second MOSFETs, and wherein said first MOSFET receives said at least one fixed reference voltage and said digital input signal.

12. A low power MOSFET buffer circuit comprising:
a pull-up MOSFET which includes a reference bias input terminal for receiving a reference bias voltage, and further includes a pull-up MOSFET output terminal;
a pull-down MOSFET which includes an input signal terminal for receiving a TTL input signal, and further includes a pull-down MOSFET output terminal coupled to said pull-up MOSFET output terminal for providing a TTL output signal in accordance with said received reference bias voltage and said received TTL input signal; and
reference bias voltage generator means coupled to said pull-up MOSFET for receiving at least one fixed reference voltage and said TTL input signal and in accordance therewith providing said reference bias voltage, wherein said reference bias voltage generator means comprises mutually coupled first and second MOSFETs, and wherein said first MOSFET receives said at least one fixed reference voltage and said TTL input signal.

13. A low power signal buffer circuit, comprising:
input signal inverter means for receiving an active reference signal and a digital input signal with a dynamic input signal amplitude range, and for inverting said received digital input signal in accordance with said received active reference signal to provide a digital output signal with a dynamic output signal amplitude range, wherein said dynamic output signal amplitude range is greater than said dynamic input signal amplitude range; and
active reference signal generator means coupled to said input signal inverter means for receiving at least one fixed reference voltage and said digital input signal and in accordance therewith providing said active reference signal, wherein said active reference signal generator means comprises mutually coupled first and second MOSFETs, and wherein said first MOSFET receives said at least one fixed reference voltage and said digital input signal.

14. A low power MOSFET buffer circuit comprising:
a pull-up MOSFET which includes a reference bias input terminal for receiving a reference bias voltage, and further includes a pull-up MOSFET output terminal;

a pull-down MOSFET which includes an input signal terminal for receiving a TTL input signal with a dynamic input signal amplitude range, and further includes a pull-down MOSFET output terminal coupled to said pull-up MOSFET output terminal for providing a TTL output signal with a dynamic output signal amplitude range in accordance with said received reference bias voltage and said received TTL input signal, wherein said dynamic output signal amplitude range is greater than said dynamic input signal amplitude range; and reference bias voltage generator means coupled to said pull-up MOSFET for receiving at least one fixed reference voltage and said TTL input signal and in accordance therewith providing said reference bias voltage, wherein said reference bias voltage generator means comprises mutually coupled first and second MOSFETs, and wherein said first MOSFET receives said at least one fixed reference voltage and said TTL input signal.

* * * * *